(12) United States Patent
Lund et al.

(10) Patent No.: US 6,624,640 B2
(45) Date of Patent: Sep. 23, 2003

(54) CAPACITANCE MEASUREMENT

(75) Inventors: John M. Lund, Marysville, WA (US); Benjamin Eng, Jr., Everett, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 09/779,137

(22) Filed: Feb. 7, 2001

(65) Prior Publication Data

US 2002/0140438 A1 Oct. 3, 2002

(51) Int. Cl.[7] ................................................ G01R 27/26
(52) U.S. Cl. ........................ 324/678; 324/658; 324/677
(58) Field of Search .................................. 324/605, 607, 324/677, 678, 649, 658

(56) References Cited

U.S. PATENT DOCUMENTS

| | | | | |
|---|---|---|---|---|
| 4,825,147 A | | 4/1989 | Cook et al. ................... 324/60 |
| 5,073,757 A | * | 12/1991 | George ........................ 324/677 |
| 5,136,251 A | * | 8/1992 | George et al. ............... 324/678 |
| 5,469,364 A | * | 11/1995 | Hughey et al. ............. 364/482 |
| 5,576,628 A | * | 11/1996 | Caliboso et al. ............ 342/678 |
| 6,191,723 B1 | * | 2/2001 | Lewis ........................ 341/166 |
| 6,275,047 B1 | * | 8/2001 | Zoellick et al. ............. 324/678 |

\* cited by examiner

*Primary Examiner*—N. Le
*Assistant Examiner*—John Teresinski
(74) *Attorney, Agent, or Firm*—George T. Noe; Richard A. Koske

(57) ABSTRACT

An apparatus and method of measuring capacitances are provided in which charge packets of known value are delivered to a capacitor of unknown value until a final voltage is determined, and the capacitance is calculated based on the known total charge and measured voltage.

7 Claims, 2 Drawing Sheets

US 6,624,640 B2

CAPACITANCE MEASUREMENT

BACKGROUND OF THE INVENTION

This invention relates generally to measurement of capacitance, and in particular to measuring capacitance by delivering charge packets of known value to a capacitor of unknown value until a final voltage is determined, and then calculating capacitance based on the known total charge and measured voltage.

Capacitance measurement is an important feature of measuring instruments such as digital multimeters. U.S. Pat. Nos. 5,073,757 and 5,136,251, both of which are assigned to Fluke Corporation, disclose methods of measuring small and large capacitances in which an unknown capacitor was allowed to fully charge to a reference voltage at its RC rate, while at the same time a current proportional to the charging current was accumulated on the storage capacitor of a dual-slope integrating analog-to-digital converter (ADC). Small capacitances could fully charge in one integrate cycle of the ADC, while large capacitances required several integrate cycles to fully charge. In both cases, the proportional charge stored on the integrating ADC's storage capacitor was removed during "de-integrate" cycles over periods of time dictated by the amount of stored charge, and the time was measured to give an indication of capacitance value.

These prior art capacitance measurement techniques were unsatisfactory due to inordinately long measurement times because of the wait for the unknown capacitor to charge fully, leading to development of the capacitance measurement system disclosed in pending U.S. patent application Ser. No. 09/267,504, filed Mar. 12, 1999, wherein a constant current source was used to generate a linear ramp voltage across the capacitor being measured. This permitted measuring differential voltage (ΔV) and differential time (ΔT) and calculating capacitance from their ratio. While both measurement speed and accuracy were improved for a wide range of capacitors, it was a relatively slow process using a complex multiple-slope analog-to-digital converter to gather the needed parameters.

A problem with all these prior art methods is that since the value of capacitor is unknown, considerable effort is expended searching for the proper range for which measurements can be made. Also, particularly near the low end of a given range, capacitance values may be distorted because of resolution compression.

SUMMARY OF THE INVENTION

In accordance with the present invention, an apparatus and method of measuring capacitances are provided in which charge packets of known value are delivered to a capacitor of unknown value until a final voltage is determined, and the capacitance is calculated based on the known total charge and measured voltage.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
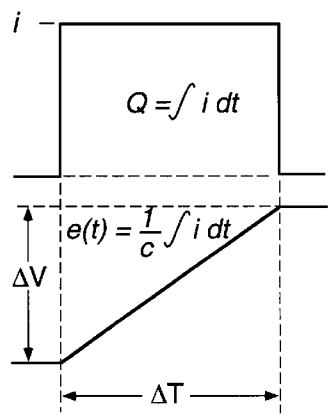
FIG. 1 is a diagram of basic current and voltage relationships associated with a capcitor to aid in understanding the present invention.

FIG. 1 is provided to aid in understanding the principles of the present invention, and shows basic current and voltage relationships associated with a capacitor. The textbook definition of capacitance is the voltage-current relationship i=C de/dt, from which capacitor voltage may be defined as $$e(t) = \frac{1}{C}\int i\,dt.$$

This provides an understanding of the well-known concept that if the current delivered to a capacitor is constant, the voltage changes linearly as the capacitor integrates the constant current over time. This can be seen in FIG. 1, where a constant current i delivered over a time interval ΔT results in a ramp voltage ΔV. Also, the integral of current over any time interval is the charge Q accumulated in the capacitor, or Q=∫idt. Thus, it can be said that the area enclosed by the current waveform in FIG. 1 is equal to the charge Q. Finally, since Q=CV, it can be seen that if the accumulated charge Q and the voltage ΔV across the capacitor are known, the capacitance value C can be calculated.

Figure 2:
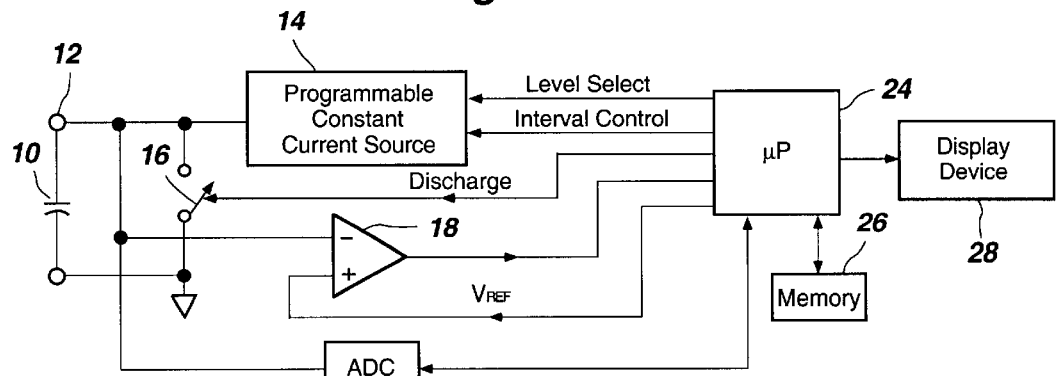
FIG. 2 is a schematic diagram of a capacitance measurement system in accordance with the present invention.

FIG. 2 is a schematic diagram of a capacitance measurement system in accordance with the present invention for measuring the capacitance value of a capacitor 10 connected to an input terminal 12. Also connected to input terminal 12 are a programmable constant current source 14, a discharge switch 16, a comparator 18, and an analog-to-digital converter (ADC) 20. Operatively coupled to all of these devices is a microprocessor (μP) 24, which includes an associated memory 26 and a display device 28.

Figure 3:
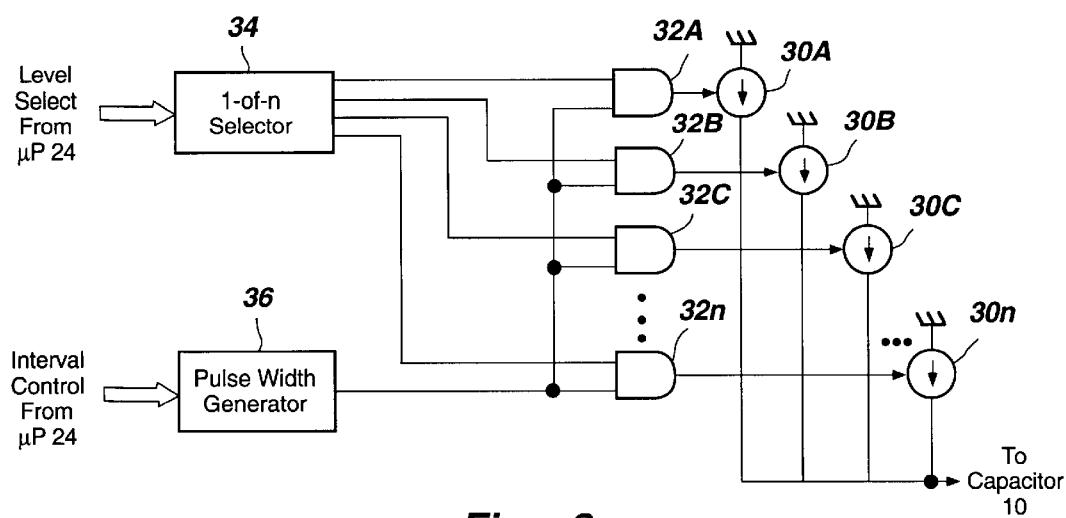
FIG. 3 is a schematic representation of a programmable constant current source suitable for use in the system of FIG. 2.

While all of the circuit elements of FIG. 2 are well known to those skilled in the art, some elaboration of programmable constant current source 14 may be in order to fully appreciate its purpose. One way of regarding programmable constant current source 14 is that in reality it is a charge packet generator because it delivers to capacitor 10 an amount of constant current (i) for a specified time interval (dt). The details of a suitable programmable constant current source are shown in FIG. 3. Shown are a plurality of constant current generators 30A, 30B, 30C, . . . , 30n, each generating a different known or predetermined value of constant current. These values may increase in any desired sequence, for example, in a binary sequence, e.g., one microampere (μA), 2 μA, 4 μA, 8 μA, etc., or in any other sequence, e.g., 1 μA, 2 μA, 5 μA, 10 μA, etc., depending upon the particular system and the availability of suitable time intervals that can be utilized. Coupled to each of the constant current generators 30A, 30B, 30C, . . . , 30n is a respective AND gate 32A, 32B, 32C, . . . , 32n. One input of each AND gate 32A–32n is from a one-of-n selector 34, which may suitably be an address counter, to select one of the constant current generators 30A–30n. The other input of each AND gate 32A–32n is from a selectable pulse width generator 36, which when activated provides a pulse of selected or predetermined width to gate the selected constant current generator on for a precise known time interval. The inputs of one-of-n selector 34 and pulse width generator 36 are provided by microprocessor 24. Thus, it can be seen that in order to send a charge packet $q_0$ to capacitor 10, microprocessor 24 selects which current generator will be gated on and for what time interval to provide the desired value $q_0 = \int i \, dt$ as an output of programmable constant current source 14.

Figure 4:
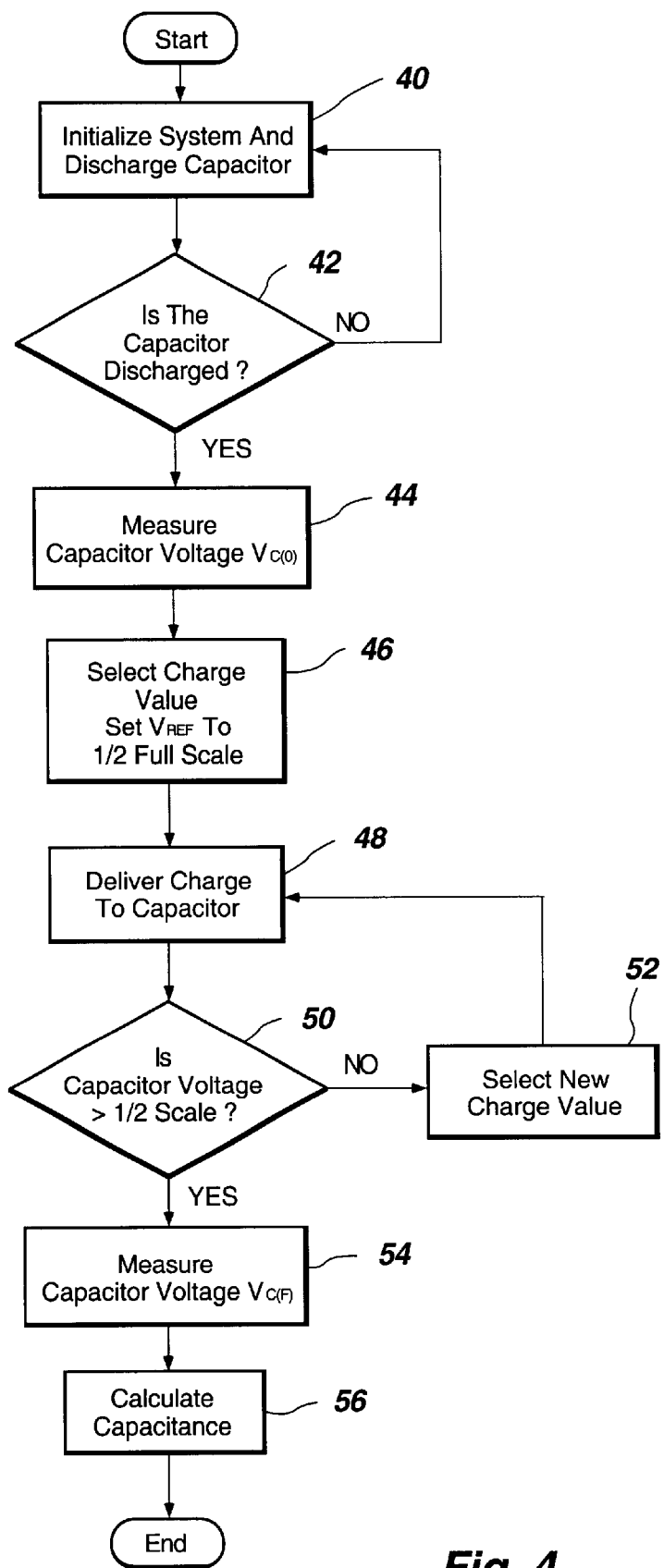
FIG. 4 is a program listing showing operation of the system of FIG. 2.

Operation of the system of FIG. 2 to determine the value of capacitance of capacitor 10 will be described in conjunction with the program shown in FIG. 4.

In step 40, the microprocessor 24 initializes the system. The (+) input of comparator 18 is set to slightly above zero volts by application of $V_{REF}(0)$ and the discharge switch 16 is closed. Any voltage on capacitor 10 is discharged through switch 16.

In step 42, the microprocessor 24 checks to see if capacitor 10 is discharged by monitoring the output of comparator 18. If the capacitor voltage is below the threshold set in step 40, the output of comparator 18 will be high, signaling the microprocessor 24 that the capacitor voltage is less than $V_{REF}(0)$. Then discharge switch 16 is opened.

It should be pointed out that comparator 18 is used here as a voltage monitoring device to monitor the capacitor voltage in comparison with threshold voltages. As will be recognized by those skilled in the art, the comparator could be replaced with a high-speed ADC and the voltage threshold levels could be set up in the firmware or software associated with microprocessor 24.

In step 44, the voltage $V_{C(0)}$ across the capacitor 10 is measured by ADC 20 and stored in memory 26. The actual reading time can be adjusted to allow for the effects of dielectric absorption, which would result in a slight increase in capacitor voltage as a small amount of charge is re-distributed within the physics of the capacitor. In such a case, switch 16 would be closed again for a short period of time to remove the residual charge and then opened again so that a new $V_{C(0)}$ reading can be made.

Again, if comparator 18 is replaced by a high-speed ADC, that ADC could perform double duty in that both comparator 18 and ADC 20 could be replaced by a single high-speed ADC. The program could indicate that the threshold has been met, and the ADC reading stored.

In step 46, microprocessor 24 selects the lowest available charge packet value $q_0$ by selecting the appropriate current level and interval combination of programmable constant current source 14 and sets comparator 18 to trip at a voltage $V_{REF}$ that is slightly below one-half for the full scale input specification of ADC 20.

In step 48, microprocessor 24 directs current from programmable current source 14 to capacitor 10 over a known time interval to place charge packet $q_0$ on the capacitor while monitoring the output of voltage comparator 18.

In step 50, if voltage comparator 18 fails to trip, it means that the charge packet delivered to capacitor 10 was insufficient to generate a voltage that reached the trip level set in step 46. If voltage comparator 18 trips, it means that the charge placed on capacitor 10 generated a voltage equal to or greater than the trip level set in step 46.

In step 52, if the voltage comparator 18 does not trip after a charge $q_0$ is placed thereon, step 48 is repeated so that capacitor has a charge $Q = q_0 + q_0$ placed thereon. If the new charge packet delivered to capacitor 10 is still insufficient to generate a voltage that reaches the trip level, microprocessor 24 selects a current level/time interval combination to provide a new charge packet $q_1 = 2q_0$ and directs this charge packet to capacitor 10. Steps 48, 50, and 52 are repeated until the total charge Q on capacitor 10 generates a voltage to trip the comparator 18, indicating the voltage generated by capacitor 10 is at some point between one-half and full scale of the specified operating window of ADC 20. Microprocessor 24 keeps track of the charge packets delivered to capacitor 10, and the total charge Q is stored in memory 26.

If the comparator 18 fails to trip after a predetermined time period that allows several attempts to find a current level/time interval combination that will generate a voltage sufficient to trip the comparator 18, the test terminates because it means the capacitor is not taking a charge for some reason.

In step 54, after the comparator 18 trips, microprocessor 24 then enables ADC 20 to measure the final voltage $V_{C(F)}$ on capacitor 10. A second reading can be made a short time later to verify that the final voltage $V_{C(F)}$ is the same as the first one, because if it is slightly lower it would indicate a leaky capacitor in which a small amount of charge bled off.

In step 56, capacitance is calculated by microprocessor 24 in accordance with the following equation:

$$C = \frac{Q_T}{\Delta V} = \frac{\sum_{n=0}^{N} q_n}{V_{Cfinal} - V_{Cstart}},$$

for the case where $q_n = q_0 + q_1 + q_2 + \ldots + q_{n-1}$. Further, it can be shown for a binary sequence as described below that $Q_T = q_0 2^{(N-1)}$, where $q_0$ is the minimum charge packet and N is the number of charge cycles for comparator 18 to indicate that the trip level set in step 46 has been exceeded.

It can be seen in the following table that the total charge Q on capacitor 10 increases in a binary sequence:

| Charge Cycle | 1 | 2 | 3 | 4 | 5 | 6, | etc. |
|---|---|---|---|---|---|---|---|
| Charge Quantity | $q_0$ | $q_0$ | $2q_0$ | $4q_0$ | $8q_0$ | $16q_0$ | ... |
| Total Charge Q | $q_0$ | $2q_0$ | $4q_0$ | $8q_0$ | $16q_0$ | $32q_0$ | ... |

This charge sequence permits capacitors having a wide range of capacitance values, e.g., eight decades of values, to be determined very quickly without searching for the appropriate capacitance range. Also, since the capacitor charges in a series of steps from nearly zero to a voltage within the upper half of the ADC operating window, that is between one-half full scale and full scale, the measurement resolution is constant over the measurement range. No resolution compression is exhibited at either end of the measurement range. The dynamic range of the technique described herein is limited only by the current levels and time intervals used in creating the charge packets, and thus is dependent on the capabilities of programmable current generator 14. For example, assume $\Delta V = 1.00$ volt is calculated from initial and final voltage measurements by ADC 20. For $Q_{min} = q_0 = 0.5$ $\mu A \times 200$ $\mu sec = 100$ pCoulombs, a capacitance of 100 pF can be measured. On the other hand, a 10,000 $\mu F$ capacitor can be measured in approximately 5 seconds with a 1 mA current source. This represents eight decades of capacitance value span (from 100 pF to 10,000 $\mu F$), or if three digits of resolution are required, six decade ranges are covered.

It can be appreciated, then, that auto-ranging for capacitance measurements is automatically part of the method described herein, obviating the need for range-hunting programs and techniques. Since capacitors are charged from an initial voltage value to a final voltage value, and capacitance value is determined from the total charge on the capacitors, resolution compression of values exhibited at the low end of capacitance ranges is avoided, representing a marked improvement over the prior art. Likewise, compression of values exhibited at the high end of an RC-time-constant curve is avoided. Moreover, faulty capacitors with dielectric absorption problems or leaky capacitors can be detected.

While we have shown and described the preferred embodiment of our invention, it will be apparent to those skilled in the art that many changes and modifications may be made without departing from our invention in its broader aspects. For example, voltage comparator 18 could be replaced with a high-speed ADC to make the start and final voltage decisions. It is therefore contemplated that the appended claims will cover all such changes and modifications as fall within the true scope of the invention.

What we claim as our invention is:

1. A method for measuring capacitance of a capacitor, comprising:
    (a) at least partially discharging said capacitor and measuring the voltage thereacross to obtain an initial voltage;
    (b) selecting a constant current value and a time interval to provide a charge packet having a predetermined value;
    (c) delivering said charge packet to said capacitor to generate a capacitor voltage proportional to a total accumulated charge;
    (d) comparing said capacitor voltage with a predetermined minimum voltage to determine whether said capacitor voltage exceeds said predetermined minimum voltage;
    (e) repeating steps (b), (c), and (d), if said predetermined minimum voltage exceeds said capacitor voltage, to provide said total accumulated charge and corresponding final voltage on said capacitor, wherein different constant current values and different time intervals may be selected to provide charge packets having different predetermined values; and
    (f) calculating said capacitance by subtracting the initial voltage from said final voltage to obtain a differential voltage, and dividing said total accumulated charge on said capacitor by said differential voltage.

2. The method for measuring capacitance in accordance with claim 1, wherein the predetermined value of a first charge packet is different from the predetermined value of a second charge packet.

3. The method for measuring capacitance in accordance with claim 2, wherein a first selected constant current value is different from a second selected constant current value.

4. The method for measuring capacitance in accordance with claim 2, wherein a first selected time interval is different from a second selected time interval.

5. An apparatus for measuring capacitance of a capacitor, comprising:
    an input terminal suitable for coupling to said capacitor;
    a discharge circuit coupled to said input terminal for discharging said capacitor and measuring the voltage thereacross to obtain an initial voltage;
    a charge circuit coupled to said input terminal for delivering predetermined charge packets to accumulate a total charge on said capacitor thereby to generate a final voltage thereacross that exceeds a predetermined minimum voltage, wherein said charge circuit comprises one or more constant current sources and one or more pulse width generators which are selectable in combination to provide charge packets having different predetermined values;
    a comparator coupled to said capacitor for iteratively comparing capacitor voltage generated across said capacitor in response to charge packets delivered thereto with a predetermined minimum voltage provided by a processor, said processor determining whether said final voltage has been reached following delivery of each charge packet and, if said predetermined minimum voltage exceeds said capacitor voltage, selecting a combination of constant current source and pulse width generator to provide a value of a next charge packet;
    a memory for storing the value of said total charge on said capacitor;
    processing means for calculating said capacitance by subtracting the initial voltage from said final voltage to obtain a differential voltage, and dividing said value of said total charge on said capacitor by said differential voltage.

6. The apparatus of claim 5, wherein said charge circuit further comprises:
    a first selectable constant current generator for supplying a first predetermined level of constant current to said capacitor; and,
    a first selectable pulse width generator for generating a first pulse width to gate said first selectable constant current generator for a first time interval so as to generate a first one of said predetermined charge packets.

7. The apparatus of claim 6, wherein said charge circuit further comprises:
    a second selectable constant current generator for supplying a second predetermined level of constant current to said capacitor; and,
    a second selectable pulse width generator for generating a second pulse width to gate said second selectable constant current generator for a second time interval so as to generate a second of said predetermined charge packets, said processing means combining said first and second predetermined charge packets to provide said total charge and generate said final voltage.

* * * * *